United States Patent [19]

Smith et al.

[11] Patent Number: 5,583,437

[45] Date of Patent: Dec. 10, 1996

[54] METHOD OF AND APPARATUS FOR NQR TESTING SELECTED NUCLEI WITH REDUCED DEPENDENCE ON A GIVEN ENVIRONMENTAL PARAMETER

[75] Inventors: John A. S. Smith, London, England; Julian D. Shaw, Encinitas, Calif.

[73] Assignee: British Technology Group Limited, London, England

[21] Appl. No.: 122,504

[22] PCT Filed: Apr. 1, 1992

[86] PCT No.: PCT/GB92/00580

§ 371 Date: Sep. 30, 1993

§ 102(e) Date: Sep. 30, 1993

[87] PCT Pub. No.: WO92/17794

PCT Pub. Date: Oct. 15, 1992

[30] Foreign Application Priority Data

Apr. 2, 1991 [GB] United Kingdom ............... 9106789

[51] Int. Cl.⁶ .................................................. G01R 33/44
[52] U.S. Cl. ........................................... 324/307.12
[58] Field of Search ............................ 324/300, 322, 324/318, 314, 315, 313

[56] References Cited

U.S. PATENT DOCUMENTS

| | | | |
|---|---|---|---|
| 4,063,150 | 12/1977 | Ohte et al. | 324/0.5 R |
| 4,514,691 | 4/1985 | De Los Santos et al. | 324/301 |
| 4,558,279 | 12/1985 | Ackerman et al. | 324/315 |
| 4,887,034 | 12/1989 | Smith | 324/307 |
| 5,109,853 | 5/1992 | Taicher et al. | 324/315 |
| 5,206,592 | 4/1993 | Buess et al. | 324/307 |
| 5,229,722 | 7/1993 | Rommel et al. | 324/307 |
| 5,254,950 | 10/1993 | Fan et al. | 324/322 |
| 5,365,171 | 11/1994 | Buess et al. | 324/307 |

FOREIGN PATENT DOCUMENTS

| | | |
|---|---|---|
| 122000 | 10/1984 | European Pat. Off. |
| 343858 | 11/1989 | European Pat. Off. |
| 1329776 | 9/1973 | United Kingdom |
| 1329647 | 9/1973 | United Kingdom |
| 2200462 | 8/1988 | United Kingdom |
| 2246636 | 2/1992 | United Kingdom |
| 8404173 | 10/1984 | WIPO |
| 9221987 | 12/1992 | WIPO |

OTHER PUBLICATIONS

M. A. McCoy et al, "Implementation of Simple Crafted 90 or 180° Pulse Shapes In Fourier Transform NMR Spectroscopy", Journal of Magnetic Resonance, 65, pp. 178–182 (1985).

Shimon Vega, "Theory of $T_1$ Relaxation Measurements in Pure Nuclear Quadrupole Resonance For Spins/=1", The Journal of Chemical Physics, vol. 61, No. 3, Aug. 1, 1974, pp. 1093–1100.

Rommel, et al: "Communications—Rotating-Frame NQR Imaging", Journal of Magnetic Resonance 91, 630–636 (1991).

Matsui, et al: "Communications—An NQR Imaging Experiment on a Disordered Solid", Journal of Magnetic Resonance 88, 186–191 (1990).

(List continued on next page.)

Primary Examiner—Sandra L. O'Shea
Assistant Examiner—Raymond Y. Mah
Attorney, Agent, or Firm—Cushman Darby & Cushman, LLP

[57] ABSTRACT

A method of NQR testing a sample having at least one NQR property which varies with a given environmental parameter comprises applying excitation to the sample to excite NQR resonance and detecting the NQR response signal. The excitation is such as to excite an NQR response signal which is detectable during the detection step over a predetermined range of the environmental parameter. The invention also relates to a method of, and apparatus for, NQR testing for the presence of selected nuclei (particularly nuclei of integral spin quantum number, such as $^{14}N$) in a sample. It also relates to a method of determining the spatial distribution of temperature within a sample.

36 Claims, 3 Drawing Sheets

OTHER PUBLICATIONS

T. Hirschfeld: "Short Range Remote NQR Measurements", Journal of Molecular Structure, 58 (1980) 63–77.

Rommel, et al: "Spectroscopic Rotating–Frame NQR Imaging (pNQRI) Using Surface Coils", Phys. Sci. Technol. 2 (1991) 866–871.

Ainbinder, et al: "Transient Phenomena in Nuclear Quadrupole Resonance", Advances in Nuclear Quadrupole Resonance, vol. 3 (1978) 67–130.

Frisch et al: "Locked Nuclear Quadrupole Resonance Spectrometer for Pressure Measurements", Journal of Research of the National Bureau of Standards, vol. 74C No. 1 & 2, (Jan.–Jun. 1970) 3–8.

METHOD OF AND APPARATUS FOR NQR TESTING SELECTED NUCLEI WITH REDUCED DEPENDENCE ON A GIVEN ENVIRONMENTAL PARAMETER

This application claims priority from United Kingdom Patent Application No. 9106789.2, filed on Apr. 2nd 1991, whose disclosure is incorporated herein by reference.

FIELD OF THE INVENTION

This invention relates to a method of, and apparatus for, Nuclear Quadrupole Resonance (NQR) testing a sample having at least one NQR property (particularly NQR resonance frequency or an NQR relaxation time, $T_1$, $T_2$, $T_{2e}$ and $T_2^*$) which varies with a given environmental parameter, such as pressure, magnetic field or more particularly temperature. It also relates to a method of, and apparatus for, NQR testing for the presence of selected nuclei (particularly nuclei of integral spin quantum number, such as $^{14}N$) in a sample. It also relates to a method of determining the spatial distribution of temperature within a sample.

As an example, the invention has application to the detection in the field of $^{14}N$ quadrupole resonance signals from the explosive RDX concealed in parcels or luggage or on the person, or deployed in explosive devices. As another example, it has application to the detection of concealed drugs, for instance at airports.

DESCRIPTION OF THE RELATED ART

NQR measurements have the advantage that they do not require the sample to be placed in a strong magnetic field, and therefore do not require the large, expensive and sample-size limiting magnet structures which are needed for nuclear magnetic resonance (NMR) measurements.

Quadrupolar nuclei have a nuclear spin quantum number I equal to or greater than unity ($I \geq 1$). If they are half integral, the quadrupole interaction (in zero magnetic field) produces two doubly degenerate levels for the case of $I=3/2$ and one allowed transition ($1/2 \rightarrow 3/2$), three doubly degenerate levels for $I=5/2$ and two strongly-allowed ($1/2 \rightarrow 3/2$, $3/2 \rightarrow 5/2$) and one weakly-allowed ($1/2 \rightarrow 5/2$) transition, and so on. For integral spin nuclei, the most important of which is $^{14}N$ with $I=1$, there are usually three levels and three transition frequencies, dropping to one for nuclei in axially-symmetric environments. All these transitions have a characteristic frequency and relaxation time (or times) which can be used to identify the substance under investigation. These frequencies and relaxation times do not depend on the presence of other substances, provided that they do not have transitions in the same frequency range.

Nuclear quadrupole resonance response signals are conventionally detected by means of pulsed radiofrequency (rf) radiation of the correct excitation frequency ($v_o$) to excite the selected transition (at a resonance frequency $v_Q$); a pulse of preset width t, rf field amplitude $B_1$, and flip angle $\alpha$ generates a decaying signal immediately following the pulse known as a free induction decay (f.i.d.), and two or more pulses of pre-set widths and spacings can generate echoes. The pulse width which produces the maximum f.i.d. for a given quadrupolar nucleus in a solid powder is given the symbol $t_m$ and the corresponding flip angle the symbol $\alpha_m$ (equivalent, for example, to a "90°" pulse in NMR).

Usually in NQR testing a repetitive pulse train is used with spacings between pulses, $\tau$, which depend on the relaxation times $T_1$, $T_2$ and $T_{2e}$, and a number of f.i.d.'s and/or echoes are accumulated to provide the required sensitivity of detection. By "sensitivity of detection" is meant the number of selected nuclei (or amount of material) that can be detected at a given level of probability in a fixed volume of sample over a given test time. This sensitivity may be further improved by Fourier transformation of the accumulated signals to give an absorption spectrum, the area under which is then measured by integration between appropriate limits. A paper by N. E. Ainbinder et al. (Advances in Nuclear Quadrupole Resonance, 3, 1978, 67-130) provides information on this background state of the art.

SUMMARY OF THE ART

The present invention seeks to provide an improved method of and apparatus for NQR testing.

According to the present invention, there is provided a method of detecting the presence of selected quadrupolar nuclei in a sample, the nuclei having at least one NQR property which varies with a given environmental parameter, comprising determining a range of the property which corresponds to a selected range of the environmental parameter, applying excitation to the sample to excite nuclear quadrupole resonance, and detecting the resonance response signal, the excitation being such that a detectable resonance response signal can be excited over the range of the property.

Attention is drawn to a paper by Hirschfeld, T. et al. entitled "Short Range Remote NQR Measurements" (J. Molecular Structure, Vol. 58, 1980, pp. 63–77).

Attention is also drawn to International Patent Application No. WO 92/21987, which has a later priority date than the present application.

The invention is based on our discovery that the NQR properties of a sample, such as resonance frequency (or frequencies), spin-lattice relaxation time ($T_1$), spin-spin relaxation time ($T_2$), effective spin-spin relaxation time ($T_{2e}$) or free induction decay relaxation time ($T_2^*$) may vary considerably with a given environmental parameter, such as temperature, pressure or magnetic field, and that it is therefore necessary to take account of or compensate for these variations when carrying out NQR tests to cover a predetermined range of the environmental parameter. Such compensation can have the unexpected advantage of considerably more sensitive tests than have hitherto been achieved.

Since the NQR testing would usually be carried out in the field, (such as at an airport), the selected range of the environmental parameter may typically be the range of that parameter likely to be encountered in the field (possibly the national or global average range or maximum range of that parameter). If the parameter is temperature, the selected range may be ±10° C. (possibly between 5° C. and 25° C.) or ±20° C. (possibly between −10° C. and +30° C.). The range may be as much as from −30° C. (corresponding to arctic conditions) to +40° C. (corresponding to desert conditions). In some industrial applications, considerably wider temperature ranges may be encountered. If the environmental parameter is pressure, the selected range may be, for example, ±1% (corresponding to a typical average daily pressure range) or ±5% (corresponding to a maximum range).

As used herein, the term "detectable" preferably connotes a signal/noise ratio which, within the measurement time of the detection step, is significantly above the actual or expected noise levels, the degree of significance being determined, for example, by standard statistical methods, such as the upper Student's t-distribution.

Take, as an example, the detection of NQR signals from the explosive RDX concealed in parcels or luggage or on the person, with the environmental parameter being temperature. The NQR property resonance frequency is considered first. The three NQR resonance frequencies, $v_x, v_y, v_z$, are all triplets due to crystal effects; near 298 degrees K., the highest set ($v_x$) occurs at 5047 ($N_1$), 5192 ($N_2$), and 5240 ($N_3$) kHz. Between 240 and 340 degrees K., their frequencies in KHz follow closely the equations $$N_1 \; v_Q^{(1)} = 5148 - 0.223T - 0.000395T^2$$

$$N_2 \; v_Q^{(2)} = 5277 - 0.139T - 0.000506T^2$$

$$N_3 \; v_Q^{(3)} = 5332 - 0.108T - 0.000670T^2 \quad (1)$$

where T is temperature.

If the RDX were in airport luggage, it might be subjected to a temperature variation of −30° to +20° C. about a mean of 20° C. (i.e. a variation from −10° to +40° C.). Different samples might be at different temperatures, and/or the same sample might have a non-uniform temperature. Equation (1) predicts that $v_Q^{(1)}$ will vary significantly (between 5041 and 5062 kHz) for a temperature range of −10° to +40° C. The present invention can, for example, provide that the excitation is such as to excite detectable NQR resonance at resonance frequencies between 5041 and 5062 KHz, that is, over a temperature range likely to be experienced with airport luggage.

Considering now the NQR property spin-lattice relaxation time ($T_1$), we have discovered that the effects on the spin-lattice relaxation time ($T_1$) of temperature (and also pressure) variations can be very significant. For example, with the RDX sample described above, over the temperature range −10° to +40° C. it is believed that $T_1$ follows the expression $$T_1 = aT^2 + be^{c/KT} \quad (3)$$

in which a and b vary according to the transition and c is about 70 kJ mol$^{-1}$. For $N_1$ in RDX $T_1$ varies, surprisingly, by a factor of approximately 8 between 5° and 25° C.

We have further discovered that one particularly important effect of the variation of $T_1$ is on the ratio $\tau/T_1$, where $\tau$ is the pulse spacing between consecutive excitation pulse repetitions (sometimes Known as the pulse repetition time). As an example, reference is made to FIG. 1, in which the variation of signal strength with flip angle ($\alpha$) is shown for different values of $\tau/T_1$. FIG. 1 is derived from equations derived by Vega (J. Chem. Phys., 1974, 61, 1099, Eq. IV-29) for spin-1 nuclei which predict the strength of the steady-state NQR signal in a powder as a function of $\tau$ for a given $T_1$; at a given ratio of $\tau/T_1$ (<5) the signal is predicted to pass through a maximum as the flip angle is varied, this maximum moving to flip angles less than $\alpha_m$ and to lower signal strengths as the ratio of $\tau/T_1$ drops below 5, as shown in FIG. 1. Suppose, at $\tau/T_1=5$, the maximum f.i.d., corresponding to a flip angle $\alpha_m$, has a relative strength of unity; at $\tau/T_1=0.1$, it has shifted to $0.3\alpha_m$ and has a relative signal strength of 0.25. For constant $\tau$ and at a constant flip angle $\alpha_m$, a variation in $\tau/T_1$ between 1 and 0.1 (an increase in $T_1$ by a factor of ten, corresponding, for $N_1$ in RDX, to a temperature increase near ambient of roughly 20° C.) gives rise to an approximately 70% loss in response signal strength. Such a loss may render the response signal undetectable if it is overwhelmed by noise. The present invention can accommodate the variation of $T_1$ with an environmental parameter such as temperature.

Further, we have also discovered that the relaxation times $T_2$, $T_{2e}$ and $T_2^*$ may vary with temperature or pressure, although in general it is believed that this variation is less marked than with $T_1$. As is well-known, $T_2$ and $T_{2e}$ are spin-spin relaxation times which are relevant to the generation of echoes. $T_2^*$ is relevant to the generation of f.i.d.'s. One important effect of the variation of the spin-spin relaxation times is on the ratios $\tau_e/T_2$, $\tau_e/T_{2e}$ and $\tau_f/T_2^*$ where $\tau_e$ is the pulse spacing between the pulses used to generate one or more echoes and $\tau_f$ is the pulse spacing between the pulses (possibly at different frequencies) used to generate f.i.d.'s. Variation of these ratios is important because response signal strength is a function of $\tau_e/T_2$, $\tau_e/T_{2e}$ and $\tau_f/T_2^*$, an exponential being one form of function which is often encountered. Again, the present invention can accommodate the variation of such relaxation times with an environmental parameter such as temperature.

In putting the Invention Into effect, if the NQR property under consideration is resonance frequency, the excitation may be at least one excitation pulse (e.g. a simple or composite pulse) at a single excitation frequency, and any or all pulses have a power spectrum sufficient to excite a detectable NQR resonance response signal over the range of resonance frequency corresponding to the range of the environmental parameter. Thus all frequencies to be encountered lie within (preferably well within) the power spectrum of the excitation pulse or pulses. A disadvantage of this approach is the high rf powers required.

Therefore, it is preferred that the excitation is applied at a plurality of different excitation frequencies so that a detectable NQR resonance response signal can be excited over the range of resonance frequency corresponding to the range of the environmental parameter. This can be achieved, for instance, by applying separate excitation pulses at different frequencies, or by frequency modulating the fundamental frequency of one or more excitation pulses, or by varying the frequency of each individual pulse.

Now the signal strength for any transition varies according to the relative values of the off-set frequency $\Delta v_o$ and the precessional frequency $v_1$ in the rf $B_1$ field:

$$v_1 = \frac{\omega_1}{2\pi} = \gamma_N B_1 / 2\pi \quad (2)$$

where $\gamma_N$ is the gyromagnetic ratio (1.932×10$^7$ rad s$^{-1}$ T$^{-1}$ for $^{14}$N nuclei). The strength falls off significantly as soon as $\Delta v_o$ becomes much larger than $v_1$. For the $N_1$ resonance at 5047 kHz in RDX, the variation is shown in FIG. 2 for a 60 μs rf pulse of $B_1$ amplitude corresponding to a value of $v_1$ of about 9 kHz; the diminution in signal strength with increasing $\Delta v_o$ becomes important when $\Delta v_o$ is greater than roughly 9 kHz.

In the present invention, by applying the excitation to the sample at a plurality of different frequencies so that a detectable NQR resonance response signal can be excited over the range of resonance frequency corresponding to the range of the environmental parameter, the maximum frequency off-set can be reduced so as to be kept within acceptable limits. From the point of view of Keeping the maximum frequency off-set within acceptable limits, the number of different frequencies at which the excitation is applied should be as large as possible. On the other hand, a conflicting requirement is that the greater the number of frequencies, the longer may be the NQR test.

In putting the invention into effect, if the NQR property under consideration is a relaxation time, then the excitation is preferably applied as a series of excitation pulses, at a plurality of different pulse spacings and/or so as to produce a plurality of different flip angles, so that a detectable NQR resonance response signal can be excited over the range of the relaxation time corresponding to the range of the environmental parameter.

This is based on our discoveries, as described above, of the effects on the spin-lattice, spin-spin and f.i.d. relaxation times of, for example, temperature and pressure variations and of the effect that these have on signal strength.

If the relaxation time under consideration is $T_1$, the pulse spacings (in this case the pulse repetition times, τ) and/or flip angles can be chosen according to the principles explained in relation to FIG. 1 to excite a detectable NQR response signal over the entire $T_1$ range of interest. If the relaxation time is $T_2$, $T_{2e}$ or $T_2^*$, since signal strength is a function of the ratio of pulse spacing to the relevant relaxation time as well as a function of flip angle, pulse spacing (in this case the spacing referred to as $\tau_e$ or $\tau_f$) may be varied in direct proportion to the relevant relaxation time, or else flip angle may be appropriately adjusted, to excite a detectable NQR response signal over the entire range of interest of the relevant relaxation time.

It is advantageous that the NQR testing takes into account variations both in resonance frequency and $T_1$ caused by variations in the environmental parameter or parameters. To achieve this, preferably the excitation is applied as a repetitive series of excitation pulses at each of a plurality of different excitation frequencies, the pulse repetition time being the same for each series, the flip angle being different for each series. One particular advantage of this arrangement is that the pulses associated with the different frequencies can be interleaved without a pulse at one frequency interfering with the response signals generated by pulses at other frequencies.

If it is desired to take into account variations in $T_2$ or $T_{2e}$, and the excitation is applied as a series of excitation pulses at each of a plurality of different excitation frequencies, each series including a plurality of pulses for generating echoes, then the spacing between each of the plurality of the pulses ($\tau_e$) is preferably different for each series (and chosen according to the variation of $T_2$ or $T_{2e}$ with the environmental parameter). The variation in $T_1$ can thus still be compensated for by varying flip angle.

If it is desired to take into account variations in $T_2^*$ and the excitation is applied as a series of excitation pulses at each of a plurality of different excitation frequencies, for generating detectable f.i.d.'s, pulses at the different frequencies are preferably applied at staggered spacings ($\tau_f$) chosen according to the variation of $T_2^*$ with the environmental parameter. $\tau_f$ may be some multiple of (say two or three times) $T_2^*$, such as allows a reasonable proportion of the f.i.d. produced by the preceding pulse to be detected before the succeeding pulse is applied, without being so long as to unnecessarily slow down the test.

These techniques for taking into account variations in $T_2$, $T_{2e}$ or $T_2^*$ are particularly advantageous when combined with the aforementioned technique for taking into account variations in resonance frequency and $T_1$. In this event, flip angle adjustment can be reserved for compensating for $T_1$ variations whilst pulse spacing adjustment can be reserved for compensating for $T_2$, $T_{2e}$ or $T_2^*$ variations. This leads to experimental simplicity.

Preferably, the excitation is such that the NQR response signal/noise ratio would be substantially equal at least two differing values of the environmental parameter. It is preferable that the signal/noise ratio would be substantially equal at as many differing values of the environmental parameter as possible, and that it would be substantially constant between these values (that Is, so that it would be substantially constant over the range of the environmental parameter). "Substantially" is to be interpreted in the context of the large variations in signal/noise ratio which may be occasioned by changes in an environmental parameter. Thus by "substantially equal" and "substantially constant" may be meant a minimum signal/noise level within 50%, 60% or preferably 75% of a maximum signal/noise level.

A particular advantage of the NQR response signal/noise ratio being substantially equal at at least two differing values of the environmental parameter and preferably substantially constant over the range of the environmental parameter is that it facilitates accurate NQR testing for the presence of selected nuclei in a sample, such as would be required in the example of RDX detection above. The invention envisages that an alarm signal would be produced if a predetermined threshold of detection were exceeded. This threshold might typically be derived from a number of tests carried out on a variety of substances other than the substance of interest in order to determine expected levels of background noise. The threshold would typically be set above these expected levels (preferably several standard deviations above these levels). By providing that the signal/noise ratio remains substantially constant over the range of the environmental parameter, the effect of the threshold will also be substantially constant. In other words, the sensitivity of detection will be substantially constant.

Substantial equality in the signal/noise ratio could be obtained by "post-processing" of the detected NQR response signal by some form of noise filter. However, it is more preferably obtained by "pre-processing", by appropriate adjustment of the response signal strengths. It will be understood that the "noise" component of the signal/noise ratio need not be specifically measured. It can usually be assumed that noise will be virtually invariant across the range of the environmental parameter. If this is so, then maintaining the signal/noise ratio substantially equal reduces to a requirement to maintain the NQR response signal strength substantially equal. If noise actually varies across the range, then a suitably varying threshold might be appropriate.

The invention envisages that the NQR response signal/noise ratio may be rendered substantially equal at the at least two differing values of the environmental parameter by compensation for resonance frequency, $T_1$, $T_2$, $T_{2e}$ or $T_2^*$ variations. Indeed, compensation may be for a combination of or even all of such variations.

If the NQR resonance frequency of the sample varies with the given environmental parameter, and the excitation is applied at a plurality of different excitation frequencies, it is preferred that the number and spacing of these frequencies is such that the NQR response signal/noise ratio is substantially constant over the range of the environmental parameter. In the example given above, if $v_Q^{(1)}$ lies between 5041 and 5062 KHz over a temperature range of $-10°$ to $+40°$ C., this range of $v_Q^{(1)}$ can be covered by the use of two excitation pulse sequences, one at a radio frequency of 5048 kHz and the other at 5055 KHz; the maximum off-set at any temperature within the specified range is $\Delta v_o = 7$ kHz, and, with this value, either one pulse train or the other will give optimum or near-optimum sensitivity of detection for a pulse width of 60 μs and $v_1 \geq 9$ kHz, with the NQR response signal strength remaining substantially constant. On the assumption that noise is constant across the frequency range of interest, the signal/noise ratio and hence the sensitivity of detection also remains substantially constant.

The spectrometer in this example is tuned to a mean frequency of 5051.5 kHz, and the probe Q factor and receiver band width are selected so that signal responses at 5041 and 5062 kHz are amplified to the same extent. After separate Fourier transformation of the accumulated f.i.d.'s or echoes from both rf pulse trains, the absorption mode signals from each are then separately integrated between frequency limits pre-set to ensure that the majority of the spectral line lies within the integration limits anywhere in the frequency range from 5041 to 5062 kHz; in this example, integration limits of (say) 2 to 10 kHz will accept a signal from one or other of the excitation frequencies of 5048, 5055 kHz. The lower limit of 2 kHz is selected to reduce the effects of changes in the base-line response signal. The integrals from both rf sequences are then separately monitored, or added to give the summed output. It will be understood that, in the example described, excitation pulses at different excitation frequencies may in some circumstances excite a single resonance frequency to a significant extent. The summed output of such pulses is not in this experiment nearly as great as if pulses were applied separately in isolation from each other, and their outputs were then summed, because the first pulse saturates subsequent response signals (although clearly this may not always be the case).

Preferably, for simplicity, the excitation is applied at n−1 equally spaced frequencies, where n is the nearest integer satisfying the equation $$n \geq \Delta v_o / \Delta v_{off},$$

where $n \geq 2$, $\Delta v_o$ is half of the value of the resonance frequency range corresponding to the range of the environmental parameter, and $\Delta v_{off}$ is approximately equal to the precessional frequency ($v_1$) (and is therefore a measure of the maximum frequency off-set above which significant reductions in response signal/noise ratio would be observed for a given resonance frequency).

The lowest frequency may therefore be $v_o - \Delta v_o/2 + \Delta v_{off}$, the next $v_o - v_o/2 + 2\Delta v_{off}$, and so on. In the example given above, the integration limits for the Fourier transformed spectrum can then be set between (say) 2 KHz and $\Delta v_{off}$. The integrals from all pulse sequences may then be monitored consecutively or summed to obtain the final output. The receiver band width and Q-factor of the rf coil would be selected to provide constant sensitivity over the frequency range from $v_o - \Delta v_o$ to $v_o + \Delta v_o$.

If a relaxation time of the sample varies with the given environmental parameter, and the excitation is applied as a series of excitation pulses at a plurality of different pulse spacings and/or so as to produce a plurality of different flip angles, the pulse spacings and/or flip angles are preferably such that the NQR response signal/noise ratio is substantially constant over the range of the environmental parameter. This can facilitate accurate NQR testing for the presence of selected nuclei in a sample, as discussed previously.

If the NQR resonance frequency of the sample also varies with the environmental parameter and the excitation pulses are applied at a plurality of different excitation frequencies, the pulse spacings and/or flip angles associated with the excitation frequencies preferably are such as to produce an NQR response signal of substantially equal signal/noise ratio at the respective values of the environmental parameter at which the NQR resonance frequency equals the respective excitation frequency. This affords a particularly simple way of compensating for the variation of resonance frequency and relaxation time.

As an example, the case where only two excitation frequencies are utilised is considered. To ensure that the sensitivity of detection at two different frequencies with different spin-lattice relaxation times remains the same, it is necessary to change the flip angle α according to Vega's equations, either by using different pulse shapes (especially widths) or different rf powers at the two frequencies. The method of selection is illustrated diagrammatically in FIG. 1 for the steady-state signal generated by pulse trains of two different ratios of $\tau/T_1$. If $\tau/T_1$ at one frequency and temperature is equal to 1, setting the flip angle to 0.17 $\alpha_m$ will give the same response signal strength as at another frequency and temperature at which $\tau/T_1=0.1$ and the flip angle is set to 0.3 $\alpha_m$. Thus the same number of accumulations at either frequency will give rise to the same integrated signal strength and therefore generally the same signal/noise ratio.

The flip angles selected will only be correct at the spot frequencies of the excitation pulses, but deviations at intermediate frequencies will be reduced in their effect if integrated signal strengths from consecutive irradiation frequencies are summed. In practice, inhomogeneities in the $B_1$ field and varying flip angles caused by temperature shifts between samples and/or temperature variations within a sample will also ensure that the idealized predictions are not followed exactly. It may therefore be necessary In a given case to apply small adjustments to the predicted flip angles to allow for such effects with a given coil geometry and NQR frequency.

Whilst the excitation might suitably take the form of simple rectangular pulses, it may be preferable that the excitation includes at least one excitation pulse which is so shaped as to produce a response signal whose strength is substantially constant over a limited resonance frequency range. Simple rectangular pulses typically have a curved response signal characteristic like that shown in FIG. 2; a relatively flat characteristic afforded by a suitably shaped pulse would have the advantage that the sensitivity of detection would be more uniform over the limited resonance frequency range. Suitable pulse shapes will be known to the skilled person. One particularly suitable shape is an Hermite pulse (see the paper by M. McCoy and W. S. Warren, J. Mag. Res., 1985, 65, 178), which has the additional advantage of requiring less power than a rectangular pulse to generate a given $B_1$ field.

The invention extends to apparatus for NQR testing a sample having at least one NQR property which varies with a given environmental parameter, comprising:

storage means in which is stored Information on how each NQR property varies over a predetermined range of the environmental parameter;

means for applying excitation to the sample to excite NQR resonance;

means for detecting the NQR response signal; and means, responsive to the Information stored In the storage means, for controlling the applying means to excite an NQR response signal which is detectable by the detection means over a predetermined range of the environmental parameter.

The invention further extends to a method of NQR testing for the presence of selected nuclei in a sample, comprising:

deriving an NQR response signal from the sample in such a way that the signal/noise ratio would be substantially equal at at least two differing values of an environmental parameter; and producing an alarm signal from the NQR response signal in dependence on whether a predetermined threshold of detection has been exceeded.

As alluded to earlier, by this arrangement, a particularly accurate and sensitive NQR test for the presence of selected nuclei can be carried out, since the signal/noise ratio will have the same significance in relation to the threshold value at the two or more differing values of the environmental parameter.

This aspect of the Invention extends to apparatus for NQR testing for the presence of selected nuclei in the sample analogous to the method described immediately above. All the features of the invention as a whole described above apply to this aspect of the invention.

The invention extends to a method as aforesaid of NQR testing a sample having at least one NQR property which varies with a given environmental parameter, the method being for determining the spatial distribution of temperature within a sample, wherein a relaxation time ($T_1$, $T_2$, $T_{2e}$, $T_2^*$) varies with temperature, and such spatial distribution is determined according to the variation of relaxation time within the sample.

This method is based on our discovery that relaxation time varies substantially with temperature. It can provide a sensitive technique for temperature distribution imaging.

It is preferred that the spatial variation distribution of temperature is determined according to the variation of the spin-lattice relaxation time, $T_1$, within the sample, since we have found that this relaxation time may be most sensitive to temperature. One preferred way of putting this method into practice is to apply a series of excitation pulses to the sample in which the pulse repetition time is varied whilst the flip angle is kept constant. The pulses would be applied, for instance, in the presence of a weak magnetic field to provide spatial encoding of the data. Decoding of the data can be carried out by well-known techniques such as Fourier analysis. $T_1$ data could be converted to temperature data via a look-up table.

The spatial distribution of temperature may also be determined according to the variation of a spin-spin relaxation time within the sample. This method would be put into practice by varying the spacing ($\tau_e$) between pulses whilst keeping the flip angle constant, in order to encode spatially data relating to the relevant relaxation times. It is thought that this technique may apply to the times $T_2$ and $T_{2e}$ but not to the time $T_2^*$, since in the case of $T_2^*$ there is no relevant pulse spacing which can be varied.

The invention extends to a method for detecting the presence within a larger article of a specific substance containing quadrupolar atomic nuclei, wherein the irradiation can allow for resonance frequency shifts caused by ±20° C. temperature variations, possibly by its frequency being modulated or varied. It also extends to a method for detecting the presence within a larger article of a specific substance containing quadrupolar atomic nuclei, wherein the power spectrum of the irradiation pulses provides substantial power within about 0.1% of any frequency to which NQR resonance may be shifted by any environmental conditions likely to apply to the article. The irradiation pulses may be at one or more frequencies equal or close to (maybe within 0.1% of) a resonant frequency of quadrupolar nuclei within the substance to be detected.

The substance may be drugs, for instance heroin or cocaine, or explosives, for instance HMX, RDX, PETN, or TNT. The quadrupolar nuclei in these substances may be $^{14}$N. The environmental conditions are such conditions as temperature, pressure or magnetic fields. One use for these methods is in the examination of airline baggage or airfreight, where in a typical case ±10 kHz resonance frequency shifts may be caused by +20° C. temperature variations. For the detection of the explosive RDX a suitable resonance frequency is 5.191 MHz; rf drive signals having a power spectrum of width 18 kHz at half height may be used to allow for the effects of the ±20° C. temperature variation.

For any aspect of the invention, apparatus features analogous to the described method features may be provided.

BRIEF DESCRIPTION OF THE DRAWINGS

Preferred features of the invention will now be described, by way of example, with reference to the accompanying drawings, in which.

DESCRIPTION OF PREFERRED EMBODIMENTS

Figure 1:
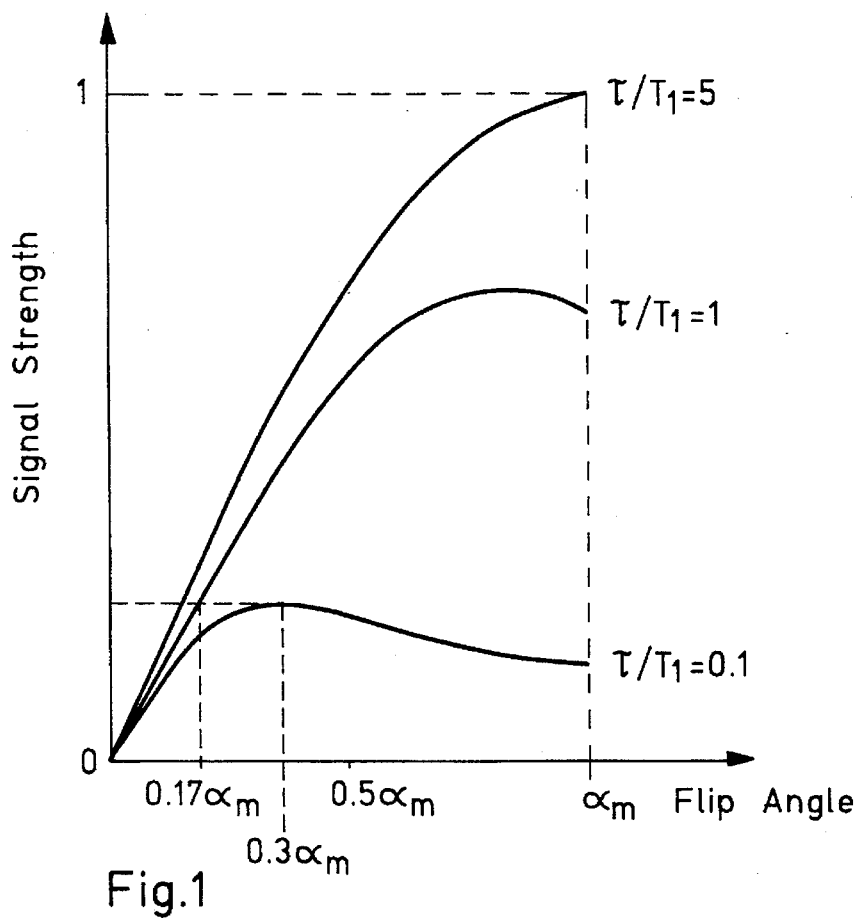
FIG. 1 is a plot of the steady-state NQR response signal strength against flip angle for differing values of the ratio $\tau/T_1$.
Figure 2:
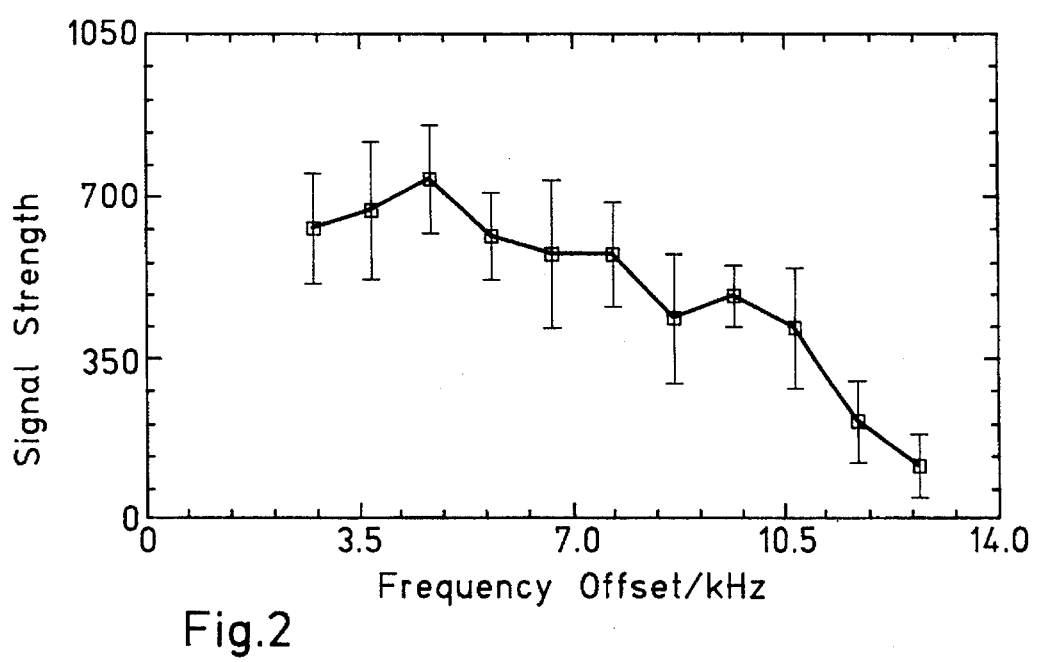
FIG. 2 is a plot of NQR response signal strength against frequency off-set for a 60 μs excitation pulse ($v_1 \approx 9$ kHz)
Figures 1, 3A:
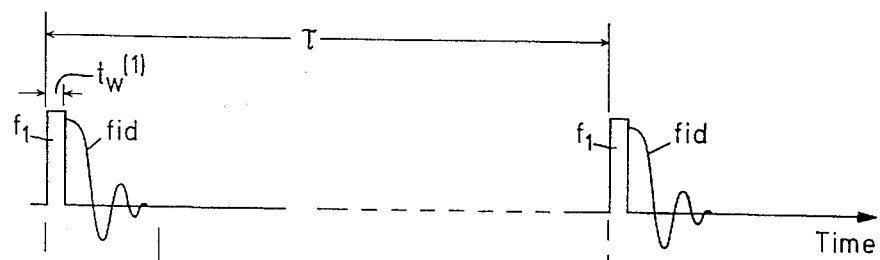
FIGS. 3(a)(1), 3(a)(2), 3(b)(1) and 3(b)(2) are timing diagrams for two embodiments of the invention.
Figures 2, 3A:
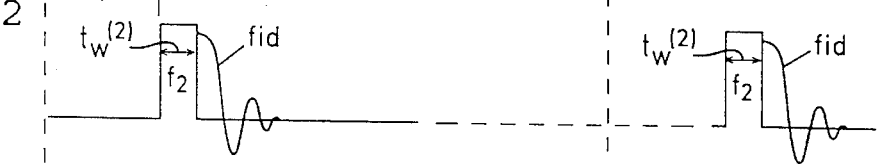

Referring to the timing diagram of the first embodiment of the invention shown in FIGS. 3(a)(1) and 3(a)(2), two radio frequency pulses (either simple or composite) of width $t_w^{(1)}$ and $t_w^{(2)}$ and of differing frequencies $f_1$ and $f_2$ are repeated at pulse repetition times $\tau(\tau \gg t_w)$ which are much longer than the longer $T_1$—say $\tau=5T_1$—to ensure full signal recovery between pulses; phase shifts of alternate pulses or suitable combinations of pulses of width $t_w$ and $2t_w$ may be used to eliminate probe ringing. After phase-sensitive detection and manipulation of the appropriate signals, the residual oscillations can be made to cancel and only the true NQR response signal is observed. Since $\tau$ is much longer than either $T_1$ value, no $T_1$ compensation is necessary (see FIG. 1).

The overall time of the test is limited by the longer $T_1$; if $\tau=5T_1$ (where $T_1$ is the longer $T_1$ value) and the allowed observation time is $T_{obs}$, the maximum number of accumulations possible is $N=T_{obs}/(t_w+\tau)=T_{obs}/(t_w+5T_1)$. Signal/noise ratio is proportional to $\sqrt{N}$, so that it is important to set the pulse repetition time $\tau$ so that $\tau$ is not significantly longer than $5T_1$; otherwise information is lost. As mentioned previously, a restriction on the separation, $\tau_f$ between the two pulses is that $\tau_f$ should exceed say $2T_2^*$ or $3T_2^*$ in order to allow the f.i.d. from the first pulse to decay substantially before the second pulse is applied Since $T_2^*$ may vary for example, with temperature, it may be important to adjust $\tau_f$ in the manner described previously to compensate for this.

In an alternative form of this first embodiment, the pulse repetition time $\tau$ is made less than $5T_1$ (where $T_1$ is now the shorter $T_1$ value) and the pulse width and/or rf power adjusted to produce flip angles which are less than $\alpha_m$ and which allow for the variation of $\tau/T_1$ with temperature, as described earlier in relation to FIG. 1. That Is, the excitation is such as would produce equal signal strengths at the temperatures at which $f_1$ and $f_2$ are the resonant frequencies. The signals are weaker than when $\tau/T_1 \approx 5$, but more can be accumulated in a given time and a lower rf power is required.

Figures 1, 3B:
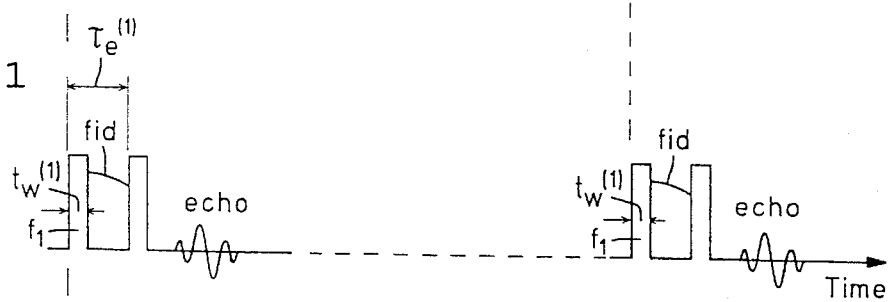
Figures 2, 3B:
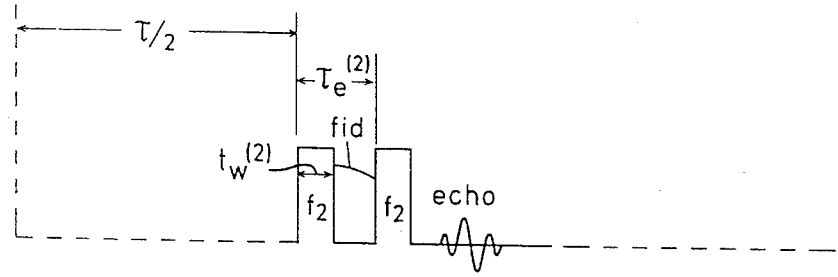

In a second embodiment of the invention shown in FIGS. 3(b)(1) and 2(b)(2), case (b), series of excitation pulses are applied at two different frequencies $f_1$ and $f_2$ to excite separate echoes at staggered intervals. The pulse repetition time τ can be equal to or less than $5T_1$ (as with the two forms of the first embodiment), and the pulse width and/or rf power may be adjusted if necessary to produce flip angles which allow for the variation of $\tau/T_1$ with NQR resonance frequency, as described earlier in relation to FIG. 1. The echoes at $\tau/T_1<5$ are weaker than when $\tau/T_1\approx5$, but more can be accumulated in a given time. In order to compensate for the variation of $T_2$ with temperature, it may be important to vary the pulse spacings between the excitation pulses $(\tau_e)$ from $f_1$ to $f_2$ so that the ratio $\tau_e/T_2$ would be constant at the temperatures at which $f_1$ and $f_2$ are the resonant frequencies.

Interleaving of the pulses in the way shown in FIGS. 3(b)(1) and 3(b)(2) is possible if $\tau>>T_2$. In the embodiment shown in FIGS. 3(b)(1) and 3(b)(2) the pulses are at only two frequencies, $f_1$ and $f_2$. However, several different radiofrequencies could be interleaved to cover as wide a temperature/frequency range as is required, consistent with the band width of the rf probe and receiver.

In a third embodiment of the invention, case (c) (not shown), a long series of short high-power rf pulses at a single frequency and appropriate phases is used with a spacing $\tau_e$ less than the spin-spin relaxation time $T_2$; the responses are then observed as a train of echoes between each pulse and decay with a time constant $T_{2e}$, where in favourable cases $T_{2e}>>T_2$. These echoes are sampled and accumulated to provide the final signal. The whole process is then repeated at one or more different frequencies. This embodiment is particularly advantageous where $T_{2e}$ is long. It will be appreciated that any temperature variation of the relaxation times, $T_1$, $T_2$ and $T_{2e}$, may need to be allowed for.

Figure 4:
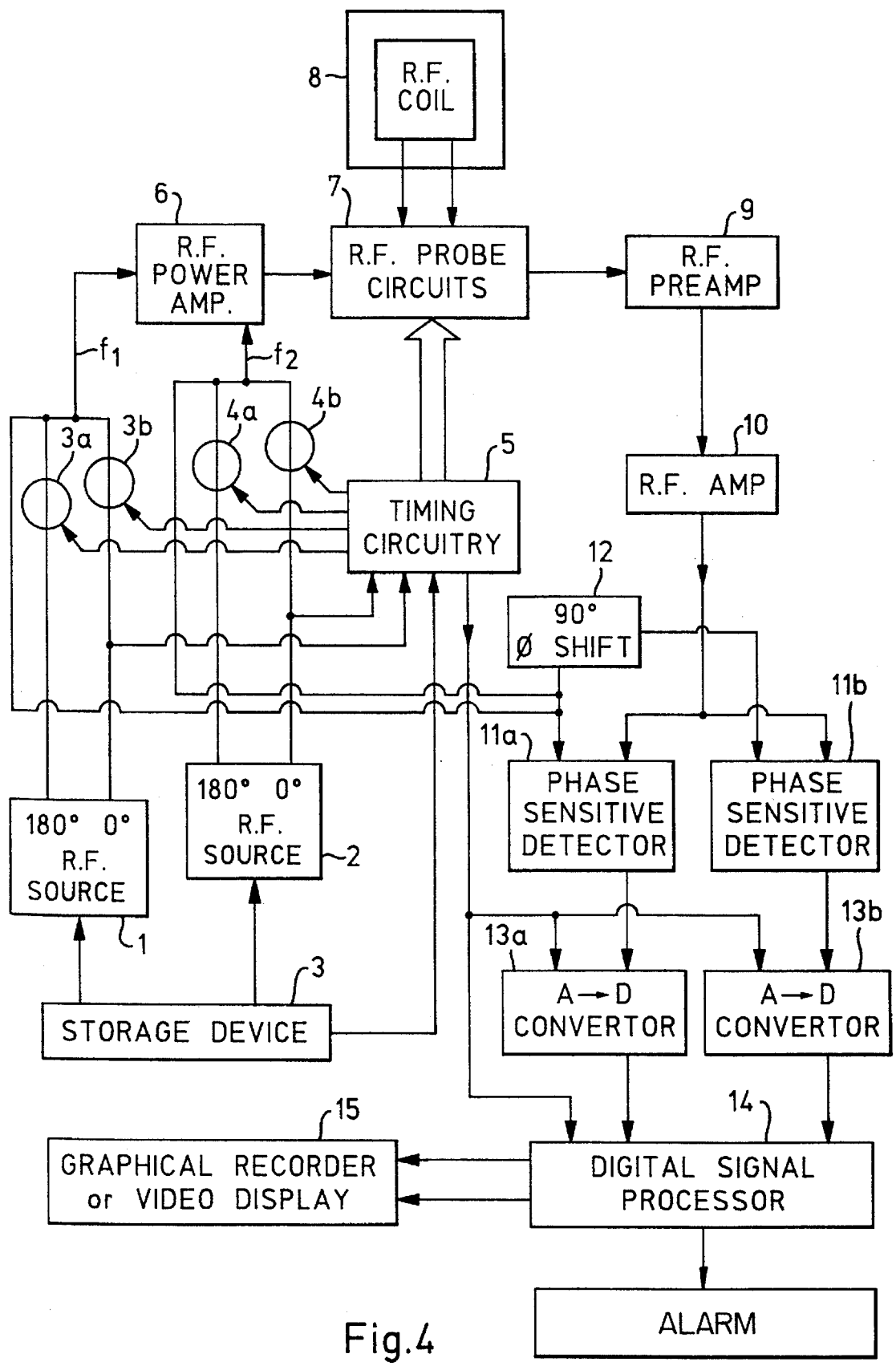
FIG. 4 is a block diagram of NQR apparatus used in the present invention.

NQR apparatus for putting the invention into effect will now be described with reference to FIG. 4. Two radio frequency sources, 1 and 2, provide pulsed rf excitation pulses at frequencies of $f_1$ and $f_2$, to cover the frequency range produced by differing sample temperatures. $f_1$ and $f_2$ are selected according to the output of a storage device 3, in which is stored information on how the NQR resonance frequency, spin-lattice relaxation time, $T_1$, spin-spin relaxation times, $T_2$, $T_{2e}$ and f.i.d. relaxation time, $T_2^*$ of the sample vary with temperature and/or pressure. More frequencies may be necessary if the frequency range is larger than a few tens of kHz. Alternatively, a switched frequency synthesizer could be used, provided that the switching time was much less than the f.i.d. time $T_2^*$ (for RDX, this quantity is about 0.8 ms at 298K).

The rf sources 1 and 2 have normal and phase-shifted outputs (typically 0° and 180°) connected through rf gates 3a,b and 4a,b which are controlled by master timing circuitry 5, which also adjusts the width of each rf pulse according to the excitation frequency, the pulse repetition time, τ, and the spin-lattice relaxation times stored in the storage device. The rf pulse sequences pass to an rf power amplifier 6 of constant output over the frequency range of the rf sources, and thence to an rf probe 7 and rf coil (or coils) 8 surrounding the sample. The rf probe receives inputs from the timing circuitry 5 so that the tuning elements can be adjusted to take account of differing excitation frequencies $f_1$, $f_2$, etc., which may be necessary for high-Q rf coils. The coils produce a uniform field over the working region of the probe. The signals generated pass to a pre-amplifier 9 and rf amplifier 10 of sufficient band width to amplify at constant gain all NQR response signal frequencies likely to be encountered. The response signals are detected in two separate phase-sensitive detectors 11a,b, to generate in-phase and quadrature outputs.

The output of gates 3a,b, controlling pulses of radio frequency $f_1$ (channel 1) Is connected as a reference signal to detector 11a and through a 90° phase-shift network 12 to detector 11b. Outputs from the detectors 11a,b are sampled and digitized by analog-to-digital converters 13a,b under the control of the timing circuitry 5 and then passed to a digital signal processor 14 for display in graphical recorder or video display 15.

The output of gates 4a,b controlling pulses of radio frequency $f_2$ (channel 2) is connected as a reference signal to the detector 11a and through the 90°-phase-shift network 12 to the detector 11b. Outputs from the detectors 11a,b are sampled and digitized by the analog-to-digital convertors 13a,b and stored in a separate memory from the signals in channel 1, this selection being controlled by trigger pulses from the timing circuitry 5. After processing in the digital signal processor 14, both signals are either separately displayed, or summed before display to provide the output of the instrument. An alarm (not shown) may then sound if this signal exceeds a pre-set threshold.

It will of course be understood that the present invention has been described above purely by way of example, and modifications of detail can be made within the scope of the invention.

We claim:

1. A method of detecting a presence of selected quadrupolar nuclei in a sample, said selected quadrupolar nuclei having at least one NQR property which varies with a given environmental parameter, said method comprising steps of:

determining a range of said at least one NQR property which corresponds to a selected range of said environmental parameter;

applying excitation to said sample to excite nuclear quadrupole resonance; and detecting a nuclear quadrupole resonance response signal;

said excitation being capable of exciting a detectable nuclear quadrupole resonance response signal throughout said range of said at least one NQR property.

2. A method according to claim 1, wherein:

said at least one NQR property is nuclear quadrupole resonance frequency;

said nuclear quadrupole resonance frequency varies with temperature; and said excitation allows for nuclear quadrupole resonance frequency shifts caused by ±20° C. temperature variations.

3. A method according to claim 1, wherein:

said at least one NQR property is nuclear quadrupole resonance frequency;

said nuclear quadrupole resonance frequency varies with said environmental parameter; and said excitation is applied at a single excitation frequency, said excitation being sufficient to excite said detectable nuclear quadrupole resonance response signal over a range of said nuclear quadrupole resonance frequency corresponding to said selected range of said environmental parameter.

4. A method according to claim 1, wherein:

said at least one NQR property is nuclear quadrupole resonance frequency;

said nuclear quadrupole resonance frequency varies with said environmental parameter; and said excitation is applied at a sufficient number of excitation frequencies that every value of said nuclear quadrupole resonance frequency in a range corresponding to said selected range of said environmental parameter is within 0.1% of at least one of said sufficient number of excitation frequencies.

5. A method according to claim 1, wherein:

said at least one NQR property is nuclear quadrupole resonance frequency;

said nuclear quadrupole resonance frequency varies with said environmental parameter; and said excitation is applied at a plurality of different excitation frequencies such that said detectable nuclear quadrupole resonance response signal can be excited over a range of said nuclear quadrupole resonance frequency corresponding to said selected range of said environmental parameter.

6. A method according to any one of claims 4 to 5, wherein:

said excitation is applied at at least one excitation frequency, said at least one excitation frequency being within said range of said nuclear quadrupole resonance frequency.

7. A method according to claim 1, wherein:

said at least one NQR property is relaxation time;

said relaxation time varies with said environmental parameter; and said excitation is applied as a series of excitation pulses having at least one of: (1) a plurality of different pulse spacings, and (2) characteristics such as to produce a plurality of different flip angles, said series of excitation pulses being capable of exciting said detectable nuclear quadrupole resonance response signal throughout a range of said relaxation time corresponding to said selected range of said environmental parameter.

8. A method of NQR testing a sample having a relaxation time which varies with a given environmental parameter, said method comprising steps of:

applying excitation of a series of excitation pulses to said sample to excite nuclear quadrupole resonance, said series of excitation pulses having at least one of: (1) a plurality of different pulse spacings, and (2) characteristics such as to produce a plurality of different flip angles, said series of excitation pulses being capable of exciting a detectable nuclear quadrupole resonance response signal throughout a range of relaxation time corresponding to a selected range of said environmental parameter; and detecting said nuclear quadrupole resonance response signal.

9. A method according to claim 8, comprising a further step of:

repetitively applying said excitation pulses at each of a plurality of different excitation frequencies, a pulse repetition time of said excitation pulses being the same for each of said repetitively applied excitation pulses, a respective flip angle being different for each of said repetitively applied excitation pulses.

10. A method according to claim 8, comprising a further step of:

applying said excitation pulses at each of a plurality of different excitation frequencies, each of said series of excitation pulses including a plurality of pulses for generating echoes, a spacing between each of said plurality of pulses being different for each of said series of excitation pulses.

11. A method according to claim 1, wherein:

said excitation is applied as a series of excitation pulses at each of a plurality of different excitation frequencies; and pulses at said plurality of different excitation frequencies are applied at staggered spacings chosen according to a variation of $T_2^*$ with said environmental parameter.

12. A method according to claim 1 or 8, wherein:

said excitation is such that a nuclear quadrupole resonance response signal/noise ratio would be substantially equal at at least two differing values of said environmental parameter.

13. A method according to claim 12, wherein:

said nuclear quadrupole resonance frequency of said sample varies with said environmental parameter; and said excitation is applied at a plurality of different frequencies, a number and a spacing of said plurality of different frequencies being such that said nuclear quadrupole resonance response signal/noise ratio would be substantially constant over said selected range of said environmental parameter.

14. A method according to claim 13, wherein:

said excitation is applied at n–1 equally spaced frequencies, where n is a nearest integer satisfying the equation $$n \geq \Delta v_o / \Delta v_{off},$$

where $n \geq 2$, $\Delta v_o$ is half of a value of a nuclear quadrupole resonance frequency range corresponding to said selected range of said environmental parameter, and $\Delta v_{off}$ is approximately equal to a precessional frequency.

15. A method according to claim 12, wherein:

a relaxation time of said sample varies with said environmental parameter; and said series of excitation pulses have at least one of: (1) a plurality of different pulse spacings, and (2) characteristics such as to produce a plurality of different flip angles, said series of excitation pulses being such that said resonance response signal/noise ratio would be substantially constant over said selected range of said environmental parameter.

16. A method according to claim 15, wherein:

a nuclear quadrupole resonance frequency of said sample also varies with said environmental parameter;

said excitation pulses are applied at a plurality of different excitation frequencies; and said at least one of: (1) said plurality of different pulse spacings, and (2) said characteristics such as to produce said plurality of different flip angles being such as would produce said nuclear quadrupole resonance response signal of substantially equal signal/noise ratio at respective values of said environmental parameter at which said nuclear quadrupole resonance frequency equals a respective one of said plurality of different excitation frequencies.

17. A method according to claim 1 or 8, wherein:

said excitation is applied at different frequencies to excite separate free induction decay responses.

18. A method according to claim 1 or 8, wherein:

said excitation is applied at different frequencies to excite separate echo responses.

19. A method according to claim 17, wherein:

said separate free induction decay responses occur at staggered intervals.

20. A method according to claim 1 or 8, wherein:

said excitation includes at least one excitation pulse which is so shaped as to produce said nuclear quadrupole resonance response signal whose strength is approximately constant over a limited range of a nuclear quadrupole resonance frequency.

21. Apparatus for NQR testing a sample having at least one NQR property which varies with a given environmental parameter, comprising:

storage means for storing information regarding how said at least one NQR property varies over a selected range of said given environmental parameter;

means for applying excitation to said sample to excite nuclear quadrupole resonance;

means for detecting a nuclear quadrupole resonance response signal; and control means, responsive to said information stored in said storage means, for controlling said means for applying to excite said nuclear quadrupole resonance response signal sufficient to be detectable by said means for detecting over said selected range of said given environmental parameter.

22. Apparatus according to claim 21, wherein:

said information stored in said storage means includes information regarding how a nuclear quadrupole resonance response frequency of said sample varies with temperature over a ±20° C. temperature range; and said control means allows for shifts of said nuclear quadrupole resonance response frequency over said ±20° C. temperature range.

23. Apparatus according to claim 21, wherein:

said information stored in said storage means includes information regarding how a nuclear quadrupole resonance response frequency of said sample varies with said environmental parameter; and said control means applies said excitation at a plurality of different excitation frequencies sufficient to cause a detectable nuclear quadrupole resonance response signal to be excited over a range of said nuclear quadrupole resonance response frequency corresponding to a range of said environmental parameter.

24. Apparatus according to claim 21, wherein:

said information stored in said storage means includes information regarding how a relaxation time of said sample varies with said environmental parameter; and said control means applies said excitation as a series of excitation pulses having at least one of: (1) a plurality of different pulse spacings, and (2) characteristics such as to produce a plurality of different flip angles, said series of excitation pulses being capable of exciting a detectable nuclear quadrupole resonance response signal over a range of said relaxation time corresponding to a range of said environmental parameter.

25. Apparatus according to claim 21, wherein:

said control means applies said excitation such that a nuclear quadrupole resonance response signal/noise ratio would be substantially equal at at least two differing values of said environmental parameter.

26. A method of NQR testing for a presence of selected nuclei in a sample, said method comprising steps of:

deriving a nuclear quadrupole resonance response signal from said sample in such a way that a signal/noise ratio would be substantially equal at at least two differing values of a given environmental parameter; and producing an alarm signal from said nuclear quadrupole resonance response signal in dependence on whether a predetermined threshold of detection has been exceeded.

27. A method according to claim 26, wherein:

said selected nuclei have at least one of a nuclear quadrupole resonance frequency which varies substantially with a variation of said environmental parameter and a nuclear quadrupole resonance relaxation time which varies substantially with said variation of said environmental parameter; and said at least two differing values are values at which said at least one of said nuclear quadrupole resonance frequency and said nuclear quadrupole resonance relaxation time are different.

28. Apparatus for NQR testing for a presence of selected nuclei in a sample, comprising:

means for deriving a nuclear quadrupole resonance response signal from said sample in such a way that a signal/noise ratio would be substantially equal at at least two differing values of a given environmental parameter; and means for producing an alarm signal from said nuclear quadrupole resonance response signal in dependence on whether a predetermined threshold of detection has been exceeded.

29. A method according to claim 1 or 8, comprising a further step of:

determining a spatial distribution of temperature within said sample;

a relaxation time of said sample varying with temperature;

said spatial distribution of temperature being determined in accordance with a variation of said relaxation time within said sample.

30. A method of detecting a presence within a larger article of a specific substance containing quadrupolar atomic nuclei, said method comprising steps of:

irradiating said specific substance to excite nuclear quadrupole resonance; and detecting a nuclear quadrupole resonance response signal, a power spectrum of said irradiation being such as to provide substantial power only within about 0.1% of any frequency to which a nuclear quadrupole resonance in said specific substance may be shifted by a ±20° C. temperature variation.

31. A method according to claim 18, wherein:

said separate echo responses occur at staggered intervals.

32. A method according to claim 26, wherein:

said nuclear quadrupole resonance response signal is derived in such a way that said signal/noise ratio would be substantially constant over a selected range of said given environmental parameter.

33. Apparatus according to claim 28, wherein:

said means for deriving derives said nuclear quadrupole resonance response signal in such a way that said signal/noise ratio would be substantially constant over a selected range of said given environmental parameter.

34. A method according to claim 1 or 8, wherein:

said excitation is such that a nuclear quadrupole resonance response signal/noise ratio would be substantially constant over said selected range of said given environmental parameter.

35. Apparatus according to claim 21, wherein:

said control means applies said excitation such that a nuclear quadrupole resonance response signal/noise ratio would be substantially constant over said selected range of said given environmental parameter.

36. A method according to claim 8, wherein:

said excitation pulses are applied at each of a plurality of different excitation frequencies; and said excitation pulses are applied at staggered spacings chosen according to a variation of $T_2^*$ with said given environmental parameter.

* * * * *